(12) United States Patent

Singh et al.

(10) Patent No.: US 9,059,723 B1
(45) Date of Patent: Jun. 16, 2015

(54) DATA DEPENDENT JITTER REDUCTION OF SWITCH DRIVER SIGNALS IN HIGH SPEED CURRENT STEERING DIGITAL-TO-ANALOG CONVERTERS

(71) Applicant: APPLIED MICRO CIRCUTS CORPORATION, Sunnyvale, CA (US)

(72) Inventors: Ramesh Kumar Singh, Cupertino, CA (US); Tarun Gupta, Santa Clara, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 14/466,316

(22) Filed: Aug. 22, 2014

(51) Int. Cl.
    H03M 1/12    (2006.01)
    H03M 1/08    (2006.01)
    H03M 1/66    (2006.01)

(52) U.S. Cl.
    CPC ............ *H03M 1/0836* (2013.01); *H03M 1/662* (2013.01)

(58) Field of Classification Search
    CPC .......................... H03M 1/0836; H03M 1/662
    USPC .......................... 341/144, 155, 160, 147, 148
    See application file for complete search history.

(56) References Cited

U.S. PATENT DOCUMENTS

| 8,433,020 B2 | 4/2013 | Buchwald et al. |
| 8,525,575 B2 | 9/2013 | Snowdon |
| 8,750,320 B2 | 6/2014 | Black et al. |
| 8,798,219 B2 | 8/2014 | Buchwald et al. |
| 8,803,572 B2 | 8/2014 | Kumar et al. |
| 2009/0021519 A1* | 1/2009 | Yusa ............................ 345/536 |
| 2014/0126286 A1* | 5/2014 | Higashitani et al. ..... 365/185.03 |

* cited by examiner

*Primary Examiner* — Peguy Jean Pierre
(74) *Attorney, Agent, or Firm* — Amin, Turocy & Watson, LLP

(57) ABSTRACT

Provided is a digital-to-analog converter configured to mitigate data dependent jitter of switch driver signals. The digital-to-analog converter is configured to produce data patterns of "0001000". The digital-to-analog converter includes a digital portion that includes a digital data input component, an analog portion, and a conversion component. The conversion component includes a decoder configured to split a first data stream comprising a set of digital data into a first data sub-stream and a second data sub-stream, and a second data stream comprising another set of digital data into a third data sub-stream and a fourth data sub-stream. The conversion component also includes a first pair of drivers, a second pair of drivers, a third pair of drivers, and a fourth pair of drivers, wherein respective drivers of the first, second, third, and fourth pairs of drivers are configured to output respective data patterns comprising at least three consecutive identical bits.

25 Claims, 10 Drawing Sheets

DATA DEPENDENT JITTER REDUCTION OF SWITCH DRIVER SIGNALS IN HIGH SPEED CURRENT STEERING DIGITAL-TO-ANALOG CONVERTERS

TECHNICAL FIELD

The subject disclosure relates generally to electronic circuits and, more particularly, to high speed current steering digital-to-analog converters and associated methods.

BACKGROUND

In electronic circuits, a digital-to-analog converter performs a function that converts digital data into an analog signal. The digital data can be binary data and the analog signal can be a current, a voltage, or an electric charge. In the case of a transmitter, a digital-to-analog converter is used to convert the digital signal to an analog signal to drive an earphone or a loudspeaker amplifier, in order to produce sound.

For example, audio signals can be stored in digital format (e.g., compact disk, MPEG-1 or MPEG-2 Audio Layer III (e.g., MP3) or another encoding format). In order for these audio signals to be heard through the speakers, the digital data is converted to the analog signal. Thus, digital-to-analog converters are employed by many devices including, but not limited to, computers, digital music players, compact disc players, sound cards, and so on.

In another example, video signals from a digital source (e.g., a computer) are converted to analog form in order to be displayed on an analog monitor. Thus, a video digital-to-analog converter is incorporated into digital video players that have analog outputs.

High speed digital-to-analog converters are used for high performance applications. For example, high speed digital-to-analog converters can be used for wireless communication. During operation of high speed current steering digital-to-analog converters, data dependent jitter of the signals driving the switches can occur. Thus, the linearity performance of the digital-to-analog converter, when generating high frequency signals at the output, can be degraded.

The above-described deficiencies of conventional approaches to digital-to-analog converters are merely intended to provide an overview of some of the problems of conventional approaches and techniques, and are not intended to be exhaustive. Other problems with conventional circuits and techniques, and corresponding benefits of the various non-limiting embodiments described herein may become further apparent upon review of the following description.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

An aspect relates to a digital-to-analog converter that can include a digital portion comprising a digital data input component configured to receive digital data and an analog portion communicatively coupled to the digital portion. The analog portion can include an analog data output component configured to output an analog signal corresponding to the digital data. The digital-to-analog converter can also include a conversion component communicatively coupled to the digital portion and the analog portion. The conversion component can include a decoder configured to split a first data stream, comprising a set of digital data, into a first data sub-stream and a second data sub-stream, and a second data stream, comprising another set of digital data, into a third data sub-stream and a fourth data sub-stream. The conversion component can also include a first pair of drivers configured to receive the first data sub-stream and a second pair of drivers configured to receive the third data sub-stream. Further, the conversion component can include a third pair of drivers configured to receive the second data sub-stream and a fourth pair of drivers configured to receive the fourth data sub-stream. Respective drivers of the first, second, third, and fourth pairs of drivers can be configured to output respective data patterns comprising at least three consecutive identical bits.

In an example, during a first clock pulse a first driver of the first pair of drivers can be configured to receive a first high signal. Further, during the first clock cycle a second driver of the first pair of drivers, the second pair of drivers, the third pair of drivers, and the fourth pair of drivers can be configured to receive respective first low signals.

In another example, during a second clock pulse, the second driver can be configured to receive a second high signal. Further to this example, during the second clock pulse the first driver, the second pair of drivers, the third pair of drivers, and the fourth pair of drivers can be configured to receive respective low signals. The first clock pulse and the second clock pulse can represent half cycles of a first clock cycle.

In a further example, during a second clock pulse, a third driver of the second pair of drivers can be configured to receive a second high signal. Further, to this example, during the second clock pulse a fourth driver of the second pair of drivers, the first pair of drivers, the third pair of drivers, and the fourth pair of drivers can be configured to receive respective second low signals.

In yet another example, during a third clock pulse, the fourth driver can be configured to receive a third high signal. Further to this example, during the third clock pulse the third driver, the first pair of drivers, the third pair of drivers, and the fourth pair of drivers can be configured to receive respective third low signals. The second clock pulse and the third clock pulse can represent half cycles of a second clock cycle.

In another example, during a third clock pulse, a fifth driver of the third pair of drivers can be configured to receive a third high signal. Further to this example, a sixth driver of the third pair of drivers, the first pair of drivers, the second pair of drivers, and the fourth pair of drivers can be configured to receive respective third low signals.

In still another example, during a fourth clock pulse, the sixth driver can be configured to receive a fourth high signal. Further to this example, the fifth driver, the first pair of drivers, the second pair of drivers, and the fourth pair of drivers can be configured to receive respective fourth low signals. The third clock pulse and the fourth clock pulse can represent half cycles of a third clock cycle.

According to still another example, during a fourth clock pulse, a seventh driver of the fourth pair of drivers can be configured to receive a fourth high signal. Further to this example, an eighth driver of the fourth pair of drivers, the first pair of drivers, the second pair of drivers, and the third pair of drivers can be configured to receive respective fourth low signals.

In a further example, during a fifth clock pulse, the eighth driver can be configured to receive a fifth high signal. Further to this example, the seventh driver, the first pair of drivers, the second pair of drivers, and the third pair of drivers can be configured to receive respective fifth low signals. The fourth clock pulse and the fifth clock pulse can represent half cycles of a fourth clock cycle.

In another example, during a fifth clock pulse, the first driver can be configured to receive a fifth high signal. Further to this example, the second driver, the second pair of drivers, the third pair of drivers, and the fourth pair of drivers can be configured to receive respective fifth low signals.

In still another example, during a sixth clock pulse, the second driver can be configured to receive a sixth high signal. Further to this example, the first driver, the second pair of drivers, the third pair of drivers, and the fourth pair of drivers can be configured to receive respective sixth low signals. The fifth clock pulse and the sixth clock pulse can represent half cycles of a fifth clock cycle.

Another aspect relates to a method that includes dividing a first data input stream into a first sub-stream and a second sub-stream and a second data input stream into a third sub-stream and a fourth sub-stream. The method can also include using a first driver in parallel with a second driver, a third driver, and a fourth driver to receive the first sub-stream, the second sub-stream, the third sub-stream, and the fourth sub-stream. The first driver can be configured to receive the first sub-stream, the second driver can be configured to receive the third sub-stream, the third driver can be configured to receive the second sub-stream, and the fourth driver can be configured to receive the fourth sub-stream. The method can also include outputting respective data patterns comprising at least three consecutive identical bits as a function of respective data signals received, during respective time periods, at the first driver, the second driver, the third driver, and the fourth driver.

In an example, the first data input stream can be an even data stream and the second data input stream can be an odd data stream. According to another example, the dividing can include using a decoder to divide the first data input stream and the second data input stream.

In another example, outputting respective data patterns comprising at least three consecutive identical bits can represent a pattern 10001 and can include performing the following. During a first time period, sending a first high signal on the first sub-stream and respective first low signals on the second sub-stream, the third sub-stream, and the fourth sub-stream. During a second time period, sending a second high signal on the third sub-stream and respective second low signals on the first sub-stream, the second sub-stream, and the fourth sub-stream. During a third time period, sending a third high signal on the second sub-stream and respective third low signals on the first sub-stream, the third sub-stream, and the fourth sub-stream. During a fourth time period, sending a fourth high signal on the fourth sub-stream and respective fourth low signals on the first sub-stream, the second sub-stream, and the third sub-stream. Further, during a fifth time period, sending a fifth high signal on the first sub-stream and respective fifth low signals on the second sub-stream, the third sub-stream, and the fourth sub-stream.

In yet another example, the method can include receiving, during the first time period, the first high signal at the first driver and respective first low signals at the second driver, the third driver, and the fourth driver. The method can also include receiving, during the second time period, the second high signal at the second driver and respective second low signals at the first driver, the third driver, and the fourth driver. Further, the method can include receiving, during the third time period, the third high signal at the third driver and respective third low signals at the first driver, the second driver, and the fourth driver. In addition, the method can include receiving, during the fourth time period, the fourth high signal at the fourth driver and respective fourth low signals at the first driver, the second driver, and the third driver. The method can also include receiving, during the fifth time period, the fifth high signal at the first driver and respective fifth low signals at the second driver, the third driver, and the fourth driver.

According to still another example, the method can include using a fifth driver in parallel with a sixth driver, a seventh driver, and an eighth driver. The fifth driver can be configured to receive the first sub-stream, the sixth driver can be configured to receive the third sub-stream, the seventh driver can be configured to receive the second sub-stream, and the eighth driver can be configured to receive the fourth sub-stream. The method can also include performing the following. During a sixth time period, sending a sixth high signal on the first sub-stream and respective sixth low signals on the second sub-stream, the third sub-stream, and the fourth sub-stream. During a seventh time period, sending a seventh high signal on the third sub-stream and respective seventh low signals on the first sub-stream, the second sub-stream, and the fourth sub-stream. During an eighth time period, sending an eighth high signal on the second sub-stream and respective eighth low signals on the first sub-stream, the third sub-stream, and the fourth sub-stream. During a ninth time period, sending a ninth high signal on the fourth sub-stream and respective ninth low signals on the first sub-stream, the second sub-stream, and the third sub-stream. Further, during a tenth time period, sending a tenth high signal on the first sub-stream and respective tenth low signals on the second sub-stream, the third sub-stream, and the fourth sub-stream.

Further to this example, the sixth time period is an interval between the first time period and the second time period and the seventh time period is an interval between the second time period and the third time period. In addition, the eighth time period is an interval between the third time period and the fourth time period, the ninth time period is an interval between the fourth time period and the fifth time period, and the tenth time period is after the fifth time period. According to some implementations, the time periods represent half clock cycles.

According to another example, the method can include receiving, during the sixth time period, the sixth high signal at the fifth driver and respective sixth low signals at the sixth driver, the seventh driver, and the eighth driver. The method can also include receiving, during the seventh time period, the seventh high signal at the sixth driver and respective seventh low signals at the fifth driver, the seventh driver, and the eighth driver. The method can also include receiving, during the eighth time period, the eighth high signal at the seventh driver and respective eighth low signals at the fifth driver, the sixth driver, and the eighth driver. In addition, the method can include receiving, during the ninth time period, the ninth high signal at the eighth driver and respective ninth low signals at the fifth driver, the sixth driver, and the seventh driver. Further, the method can include receiving, during the tenth time period, the tenth high signal at the fifth driver and respective tenth low signals at the sixth driver, the seventh driver, and the eighth driver.

According to some implementations, the method can include producing, by the fifth driver, an output signal characterized by a data stream 10001.

A further aspect relates to an integrated circuit that can include a decoder configured to split a first data input stream into a first sub-stream and a second sub-stream, and a second data input stream into a third sub-stream and a fourth sub-stream. The integrated circuit can also include a first driver in parallel with a second driver. The first driver can be configured to receive the first sub-stream and the second driver can be configured to receive the third sub-stream. Further, the integrated circuit can include a third driver in parallel with the second driver. The third driver can be configured to receive the second sub-stream. Also included can be a fourth driver in parallel with the third driver. The fourth driver can be configured to receive the fourth sub-stream. Further, the integrated circuit can include a clock generator configured to output data representative of a plurality of clock pulse signals. The first driver can be configured to output "1" during a first clock pulse, "0" during a second clock pulse, a third clock pulse, and a fourth clock pulse, and "1" during a fifth clock pulse.

In an example, the second driver can be configured to output "0" during the first clock pulse, the third clock pulse, the fourth clock pulse, and the fifth clock pulse, and to output "1" during the second clock pulse and a sixth clock pulse.

In another example, the third driver can be configured to output "0" during the first clock pulse, the second clock pulse, the fourth clock pulse, the fifth clock pulse, a sixth clock pulse, and to output "1" during the third clock pulse and a seventh clock pulse.

In still another example, the fourth driver can be configured to output "0" during the first clock pulse, the second clock pulse, the third clock pulse, the fifth clock pulse, a sixth clock pulse, and a seventh clock pulse, and to output "1" during the fourth clock pulse and an eighth clock pulse.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Various non-limiting embodiments are further described with reference to the accompanying drawings in which.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the disclosure, as generally described herein, and illustrated in the Figures, can be arranged, substituted, combined, separated, and designed in a wide variety of different configurations, all of which are explicitly contemplated herein.

To reduce the data dependent jitter of the signals driving the switches of high speed current steering digital-to-analog converters, the disclosed aspects provide an architecture that improves the linearity performance of digital-to-analog converters when generating high frequency signals at an output of the digital-to-analog converter. The architecture provided can be configured to multiplex (mux) the half rate digital-to-analog converter data in order to realize a very high speed digital-to-analog converter. These digital-to-analog converters can be used as a transmitter for very high bandwidth communication applications. Such applications include 1000 Coherent Technology, 1000 SMF and High speed serial links using multi-level signaling, for example.

Figure 1:
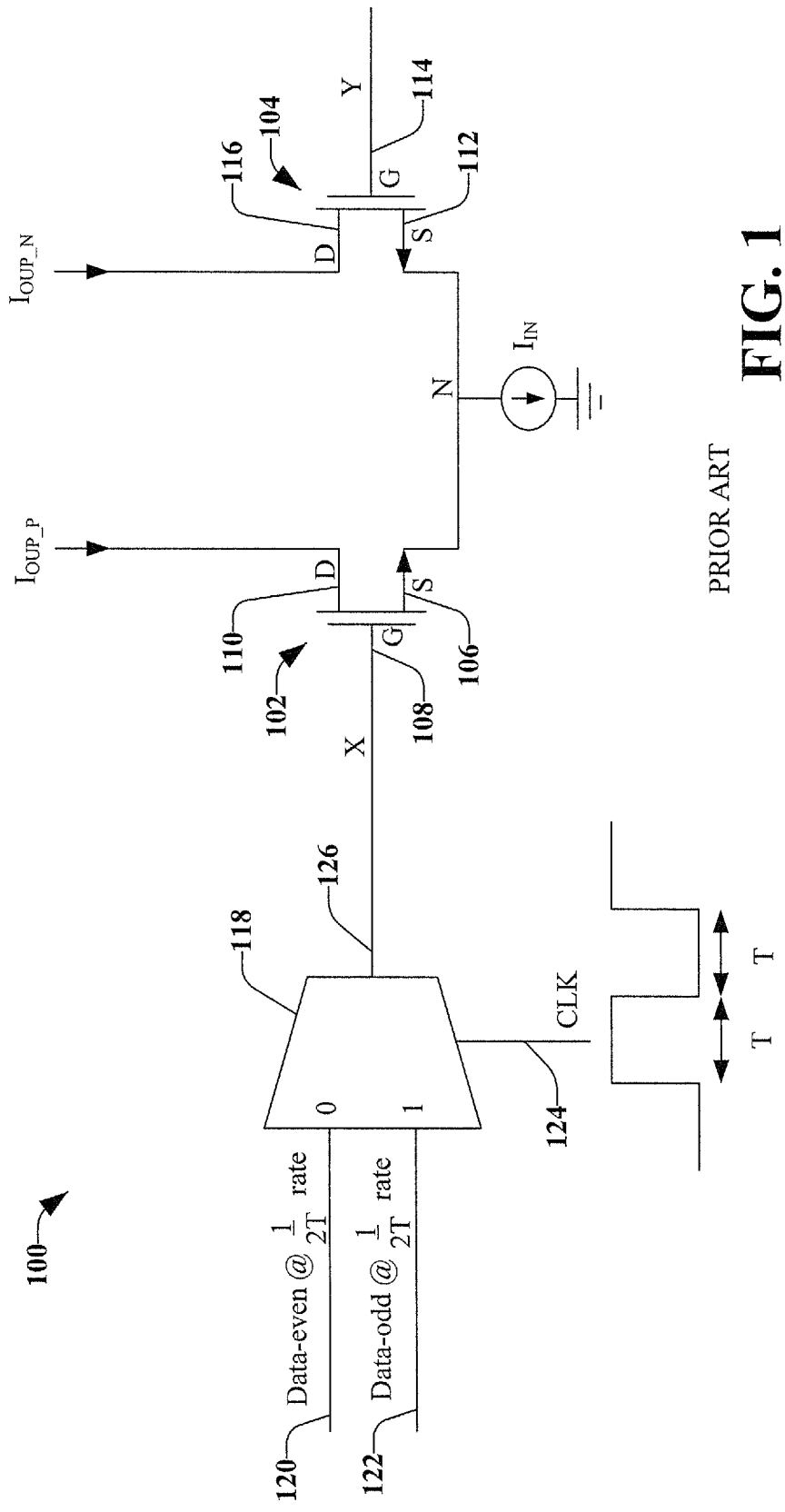
FIG. 1 illustrates a schematic representation of a circuit for multiplexing of data in high speed digital-to-analog converters.

FIG. 1 illustrates a schematic representation of a circuit 100 for multiplexing of data in high speed digital-to-analog converters. The circuit 100 is configured for multiplexing of data in high speed digital-to-analog converters. The circuit 100 provides for multiples of half-rate odd and even data using a CMOS Multiplexer.

In further detail, the circuit 100 includes a pair of metal-oxide-semiconductor field-effect transistors (MOSFETs), illustrated as a first MOSFET 102 and a second MOSFET 104. A MOSFET is a transistor that is used to amplify or switch electronic signals. Each MOSFET includes a source terminal (S), a gate terminal (G), and a drain terminal (D). Although, each MOSFET includes a body terminal (B), the body terminal is usually connected to the source terminal, rendering the MOSFET a three terminal device.

Therefore, as illustrated in FIG. 1, the first MOSFET 102 includes a first source terminal 106, a first gate terminal 108, and a first drain terminal 110. In a similar manner, the second MOSFET 104 includes a second source terminal 112, a second gate terminal 114, and a second drain terminal 116.

The first MOSFET 102 and the second MOSFET 104 receive an input current $I_{IN}$ at respective source terminals, namely the first source terminal 106 and the second source terminal 112. The first gate terminal 108 represents a Node X, and the second gate terminal 114 represents a Node Y.

The first gate terminal 108 of the first MOSFET 102 is illustrated connected to a multiplexer 118, which is a device that selects an input signal from two or more input signals and forwards the selected input signal into a single output line. The input signals, for example, can be digital input signals (e.g., have a digital value).

The illustrated multiplexer 118 includes two inputs, labeled as a first input line 120 ("O") and a second input line 122 ("1"). The multiplexer 118 also includes a selector line 124 and a single output line 126. Although the illustrated multiplexer 118 is a two to one multiplexer (e.g., two input lines and one output line), multiplexers having more or fewer input lines and/or output lines can be utilized.

In operation, a selection of the first input line 120 (e.g., a logic value of 0), would connect Data-even to the output line 126 and selection of the second input line 122 (e.g., a logic value of 1), would connect Data-odd to the output line 126.

It is noted that there is a similar, complementary circuitry connected to the second MOSFET 104. However, this circuitry is not illustrated or described for purposes of simplicity. Further, the operation of MOSFETs is well known to those of skill in the art and so will not be further described herein The illustrated circuit 100 is for a current scaling digital-to-analog converter. Therefore, to generate output, when the signal at Node X (e.g., first gate terminal 108) is high, the current goes through the left branch (e.g., the first MOSFET 102). In a similar manner, when the signal at Node Y (e.g., the second gate terminal 114) is high, the current goes through the right branch (e.g., the second MOSFET 104). This provides a differential output, which is $I_{OUT\_P}$ and $I_{OUT\_N}$, respectively.

In order to obtain the data signal, a low speed data stream or a half speed data stream is used. For purposes of discussion, one half stream will be referred to as "even"; the other half stream will be referred to as "odd." For example, the even stream is at the first input line 120; the odd stream is at the second input line 122. Thus, the data stream at the first input line 120 is represented as data-even at ½T rate, where T is the data rate; the data stream at the second input line 122 is represented as data-odd at ½T rate. Thus, the multiplexer 118 receives even data and odd data at the inputs (e.g., first input line 120 and second input line 122). It is noted that although ½T rate is described, other rates could be utilized.

Further to this example, the clock (CLK) is selected at half frequency, where the clock is used as the select input. If the data rate is T, the data period is 1/T (the frequency is ½T). For duration T, odd data will be received at the multiplexer 118 and for another duration T, even data will be received at the multiplexer 118. Thus, data is being serialized at Node X (and in a similar manner complimentary data at Node Y, although the circuitry at Node Y is not illustrated for purposes of simplicity).

The switch driver signals (X, Y) have large data dependent jitter (DDJ), also referred to as inter symbol interference, due to high data rates and finite bandwidth of the multiplexer driving the signals X and Y. The source of the data dependent jitter is the presence of patterns "0101" and "00100". This data dependent jitter degrades the linearity of the digital-to-analog converter, which can be more pronounced at high output frequencies and therefore, these patterns should be disrupted.

For example, a two-to-one multiplexer, such as the multiplexer of FIG. 1 has a Boolean equation, which can be expressed as, $$Z = (A * \overline{S}) + (B * S) \qquad \text{Equation 1.}$$

where Z is the output (e.g., at output line 126), A is the first input (e.g., at first input line 120), B is the second input (e.g., at second input line 122), and S is the selector input (e.g., at the selector line 124). This can be expressed in the following truth table:

TABLE 1

| S | A | B | Z |
|---|---|---|---|
| 0 | 1 | 1 | 1 |
| 0 | 1 | 0 | 1 |
| 0 | 0 | 1 | 0 |
| 0 | 0 | 0 | 0 |
| 1 | 1 | 1 | 1 |
| 1 | 1 | 0 | 0 |
| 1 | 0 | 1 | 1 |
| 1 | 0 | 0 | 0 |

As illustrated in the truth table of Table 1, if S is 0, then the value A is the output; if S is 1, then the value of B is the output.

Accordingly, when there is an output data pattern, such as "0101" or "001001001", and so on, the level does not set completely to level 0 or to level 1. Instead, if there are all zeros, and then a pulse of 1 (and assuming level 1 corresponds to 1 volt), because of the limited bandwidth, the circuit might only reach 0.9 volt. Then, after a few time intervals, the circuit might return to zero volts.

In another example, where there is a "01010" pattern, the waveform will be different since the pattern is different. In this example, a pulse of 1 might result in a lower voltage level, such as 0.7 or 0.8. Further, a pulse of 0 will not return to a zero voltage level, since it is continuously switching and due to the very high frequencies, because it does not settle at these high frequencies. Thus, data dependent jitter is produced.

Figure 2:
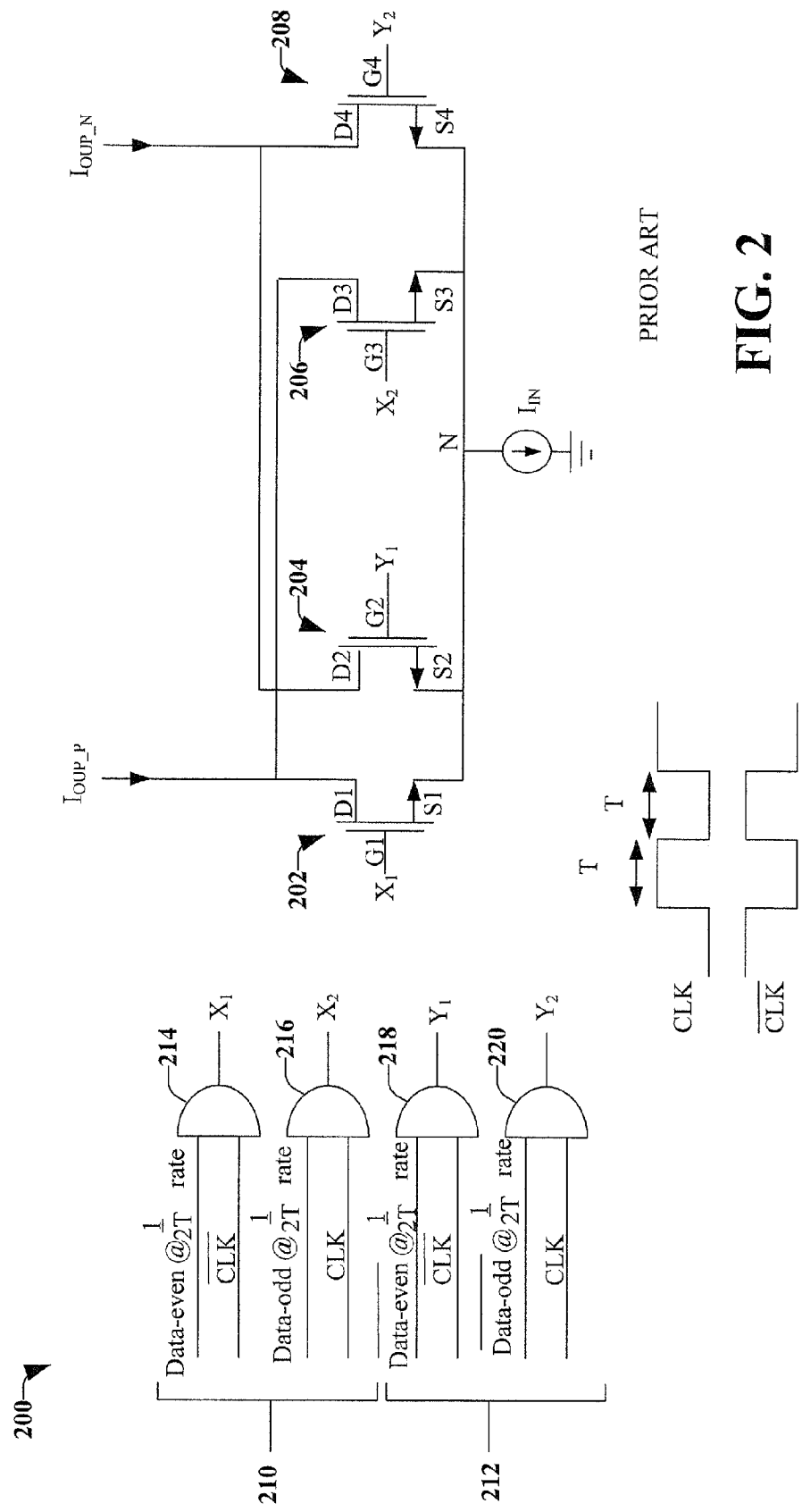
FIG. 2 illustrates a schematic representation of another circuit for multiplexing of data in high speed digital-to-analog converters.

FIG. 2 illustrates a schematic representation of another circuit 200 for multiplexing of data in high speed digital-to-analog converters. This circuit 200 is configured to multiplex the half-rate odd-data and even data using one or more pair of switches, which are controlled by X2 and Y2. Circuit 200 illustrates an implementation of multiplexing of data in high speed digital-to-analog converters.

The circuit 200 includes two pairs of metal-oxide-semiconductor field-effect transistors (MOSFETs). The first pair of MOSFETs includes a first MOSFET 202 and a second MOSFET 204. The second pair of MOSFETS includes a third MOSFET 206 and a fourth MOSFET 208.

Similar to the circuit 100 of FIG. 1, each MOSFET includes a source terminal (S), a gate terminal (G), and a drain terminal (D). Elements numbers are not provided for these terminals for purposes of simplicity. Instead, the terminals are designated by their respective alpha-numeric designations, wherein G1 refers to the gate terminal of the first MOSFET 202, G2 refers to the gate terminal of the second MOSFET 204, and so on. Similar reference alpha-numeric references are made for the source terminals (S) and the drain terminals (D).

Each of the first MOSFET 202, the second MOSFET 204, the third MOSFET 206, and the fourth MOSFET 208 receives an input current $I_{IN}$ at respective source terminals, namely S1, S2, S3, and S4. The respective drain terminals D1 and D3 of the first MOSFET 202 and the third MOSFET 206 are connected and produce an output signal $I_{OUT\_P}$. In a similar manner, the respective drain terminals D2 and D4 of the second MOSFET 204 and the fourth MOSFET 208 are connected and produce another output signal $I_{OUT\_N}$. The generation of these differential output current signals, $I_{OUT\_P}$ and $I_{OUT\_N}$ will now be described in further detail.

In accordance with this circuit 200, a multiplexer is not reduced to 1 multiplexer (as in the case of FIG. 1). Instead, the multiplexing is performed with the use of the differential pair drivers illustrated on the left of the figure. The differential pair drivers include a first pair 210 and a second pair 212. The first pair 210 includes a first driver 214 and a second driver 216. The second pair 212 includes a third driver 218 and a fourth driver 220.

The input lines of the first driver 214 includes a data_even line at ½T, and a clock input line ($\overline{CLK}$). The output $X_1$ of the first driver 214 corresponds to the gate terminal G1 of the first MOSFET 202. The input lines of the second driver 216 include a data_odd line at ½T and a clock input line (CLK). The output $X_2$ of the second driver corresponds to the gate terminal G3 of the third MOSFET 206.

The input lines of the third driver 218 include a data_even line ($\overline{Data\_even}$) and a clock input line ($\overline{CLK}$). The output $Y_1$ of the third driver 218 corresponds to the gate terminal G2 of the second MOSFET 204 The input lines of a fourth driver 220 include a data_odd line ($\overline{Data\_odd}$) and a clock input line (CLK). The output line of the fourth driver 220 corresponds to the gate terminal G4 of the fourth MOSFET 208.

In operation, half rate even data is provided at $X_1$ and $Y_1$ and half rate odd data is provided at $X_2$ and $Y_2$. In such a manner, the multiplexing is achieved. For purposes of explanation, it will be assumed that when the clock is high, odd data is provided and further, when the clock is low, even data is provided. It should be noted that this is just for example purposes and in other implementations, when the clock is high, even data can be provided and, further, when the clock is low, odd data can be provided. The clock waveforms are illustrated at the bottom of the figure.

Continuing with the example, when the clock is high, the $X_1$ and $Y_1$ pair are zero and the $X_2$ and $Y_2$ pair is used to determine the direction of the current flow as a function of the odd data signal. When the clock goes low, the $X_2$ and $Y_2$ pair turns off and the $X_1$ and $Y_1$ pair is used to determine the direction of the current flow as a function of the even data signal. Thus, both FIG. 1 and FIG. 2 are designed for multiplexing, however, FIG. 2 provides a switching activity that has an improved linear performance as compared to FIG. 1.

In the circuit 200 of FIG. 2, only one of the switches, $X_1$, $Y_1$, $X_2$, and $Y_2$ will be "1" at a given time, all others will be at the "0" level. However, the architecture of circuit 200 also has the issue of large data dependent jitter due to the presence of patterns "0101" and "00100" on $X_1$, $Y_1$, $X_2$, and $Y_2$. It is noted that FIG. 2 has the pattern "0101" because the even data will be "1" in the first period, goes to "0" in the second period, then returns to "1" in the third period, and so on. In accordance with the various aspects disclosed herein, the pattern "0101" can be eliminated, resulting in a reduction of the data dependent jitter.

Figure 3:
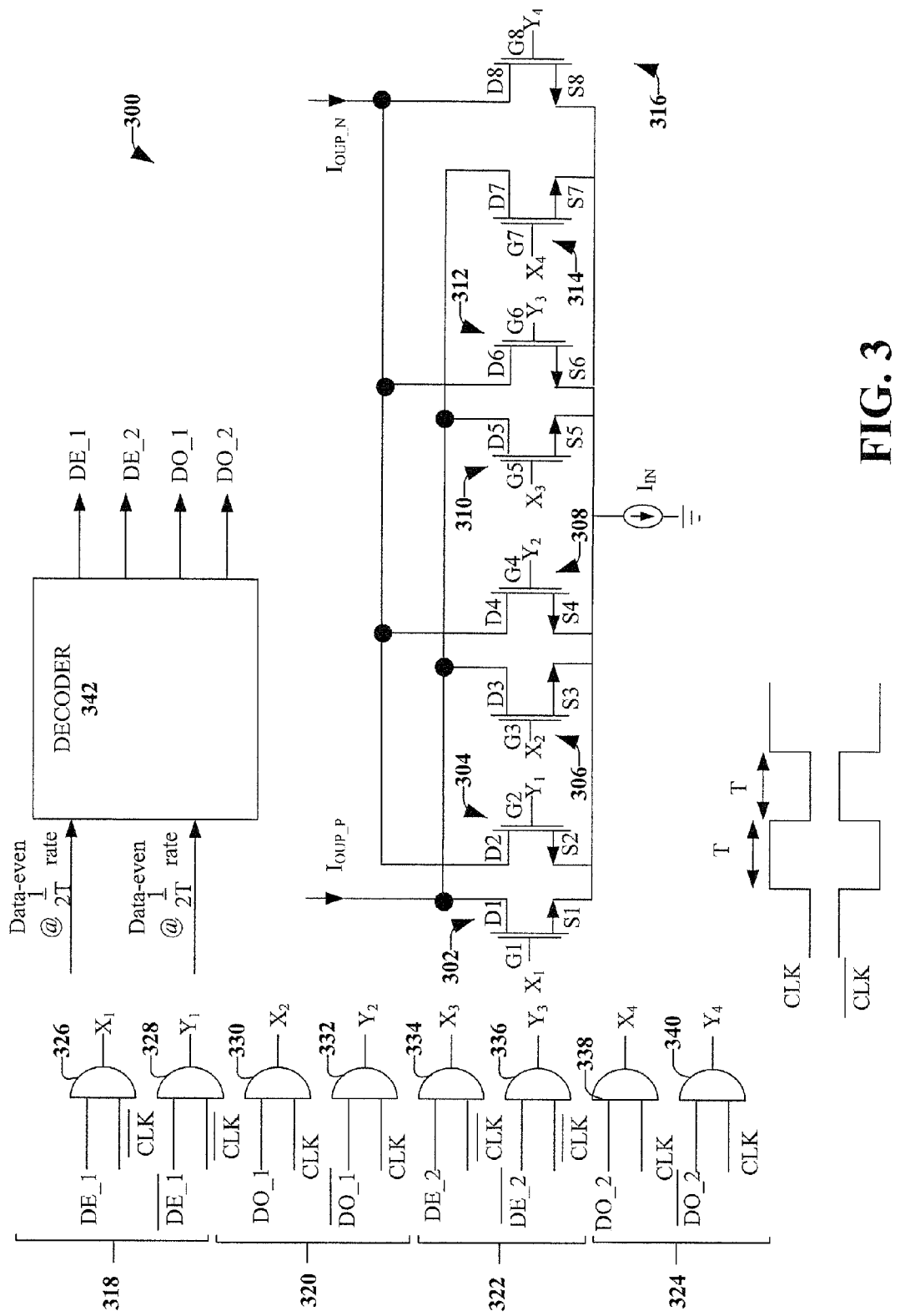
FIG. 3 illustrates an example, non-limiting schematic representation of a digital-to-analog converter that can be configured to facilitate data dependent jitter reduction of switch driver signals, according to an aspect.

FIG. 3 illustrates an example, non-limiting schematic representation of a digital-to-analog converter 300 that can be configured to facilitate data dependent jitter reduction of switch driver signals, according to an aspect. The digital-to-analog converter 300 can be implemented as a high speed current steering digital-to-analog converter, according to an implementation.

The digital-to-analog converter 300 can be implemented using discrete components. In accordance with some aspects, the digital-to-analog converter 300 can be implemented in an integrated circuit. In further aspects, the digital-to-analog converter 300 can be implemented in any combination of integrated circuits and discrete components formed in accordance with a single manufacturing technique or a combination of manufacturing techniques.

The digital-to-analog converter 300 can include four pairs of metal-oxide-semiconductor field-effect transistors (MOSFETs). The first pair of MOSFETs can include a first MOSFET 302 and a second MOSFET 304. The second pair of MOSFETS can include a third MOSFET 306 and a fourth MOSFET 308. Further, the third pair of MOSFETs can include a fifth MOSFET 310 and a sixth MOSFET 312. The fourth pair of MOSFETs can include a seventh MOSFET 314 and an eighth MOSFET 316.

It is noted that although N-channel MOSFETs are illustrated, P-channel MOSFETs might be utilized, according to an implementation. For example, for a N-channel MOSFET, the source and drain are "n+" regions and the body is a "p" region. For a P-channel MOSFET, the source and drain are "p+" regions and the body is an "n" region".

As illustrated, each MOSFET includes a source terminal (S), a gate terminal (G), and a drain terminal (D). The source terminal (5) is the source of the current, the drain (D) is where the current leaves the channels. Elements numbers are not provided for these terminals for purposes of simplicity. Instead, the terminals are designated by their respective alpha-numeric designations, wherein D1 refers to the drain terminal of the first MOSFET 302, D2 refers to the drain terminal of the second MOSFET 304, D3 refers to the drain terminal of the third MOSFET 306, and so on. Similar reference alpha-numeric references are indicated for the source terminals (S) and the gate terminals (G).

Each of the MOSFETS 302-316 receives an input current $I_{IN}$ at respective source terminals, namely S1, S2, S3, S4, S4, S6, S7, and S8. The respective drain terminals D1, D3, D5, and D7 of the first MOSFET 302, the third MOSFET 306, the fifth MOSFET 310, and of the seventh MOSFET 314 are connected and produce an output signal $I_{OUT\_P}$. In a similar manner, the respective drain terminals D2, D4, D6, and D8 of the second MOSFET 304, the fourth MOSFET 308, the sixth MOSFET 312, and the eighth MOSFET 316 are connected and produce another output signal $I_{OUT\_N}$ The generation of these differential output current signals, $I_{OUT\_P}$ and $I_{OUT\_N}$ will now be described in further detail.

Illustrated on the left of the figure, the MOSFETS are represented as four differential pair drivers that include a first pair 318, a second pair 320, a third pair 322, and a fourth pair 324. The first pair 318 includes a first driver 326 and a second driver 328. The second pair 320 includes a third driver 330 and a fourth driver 332. Further, the third pair 322 includes a fifth driver 334 and a sixth driver 336. The fourth pair 324 includes a seventh driver 338 and an eighth driver 340.

The circuit also includes a decoder 342, illustrated at the top of the figure. The decoder can be a standard decoder. In an implementation, the decoder is a two-input, four-output decoder. A first input line of the decoder 342 receives an even data stream at the rate of ½T and the second input line receives an odd data stream at the rate of ½T. The decoder splits the received even data stream into two streams, illustrated as a first even data output stream (DE_1) and a second even data output stream (DE_2). Further, the decoder 324 splits the received odd data stream into two streams, illustrates a first odd data output stream (DO_1) and a second odd data output stream (DO_1).

By way of example and not limitation, the even data is always "1" as discussed herein. Further to this example, reference will be made to the output of the first driver 326 (X1) and the output of the fifth driver 334 (X3). On a first bit period, even data is transmitted and a "1" is sent out on X1 and a "0" is sent on X3. On a next bit period, odd data is transmitted and both X1 and X3 are "0". On a following bit period, even data is transmitted, and this time instead of transmitting on X1, the data is transmitted on X3. Therefore, a "0" is sent out on X1 and a "1" is sent out on X3. On the next cycle, when odd data is transmitted, both X1 and X3 will be zero. On a subsequent cycle, even data is transmitted on X1 (e.g., a "1" is transmitted on X1 and a "0" is transmitted on X3), and so on. In this manner, a bit pattern of "10001" is achieved, for example, at X1. Thus, there is no high frequency pattern "0101".

With a pattern of "10001" or "0001000", when the "1" arrives, there is time for all the "0s" to settle. After the "1", the circuit goes back to "0" and settles due to the three sequential "0s." The other data patterns output on the other switches have a similar pattern (and an identical shape whenever the pulse of "1" arrives) and, therefore, the data dependent jitter is very small (if not eliminated).

Thus, as illustrated in FIG. 3, the four pairs of switches are controlled by signals X1, Y1, X2, Y2, X3, Y3, X4, and Y4, which are generated by a decoder that uses half-rate odd data and half-rate even data as its input. For the pattern "0101" (meaning data_even will be "1" for two consecutive ½T periods), first "1" will be transmitted on DE_1 and the second "1" will be sent on DE_2. With this arrangement, none of the signals (X1, Y1, X2, Y2, X3, Y3, X4, and Y4) will have a "0101" pattern, which reduces data dependent jitter. Further, all of the above signals will only have the "0001000" pattern whenever they transition from "0" to "1".

Figure 4:
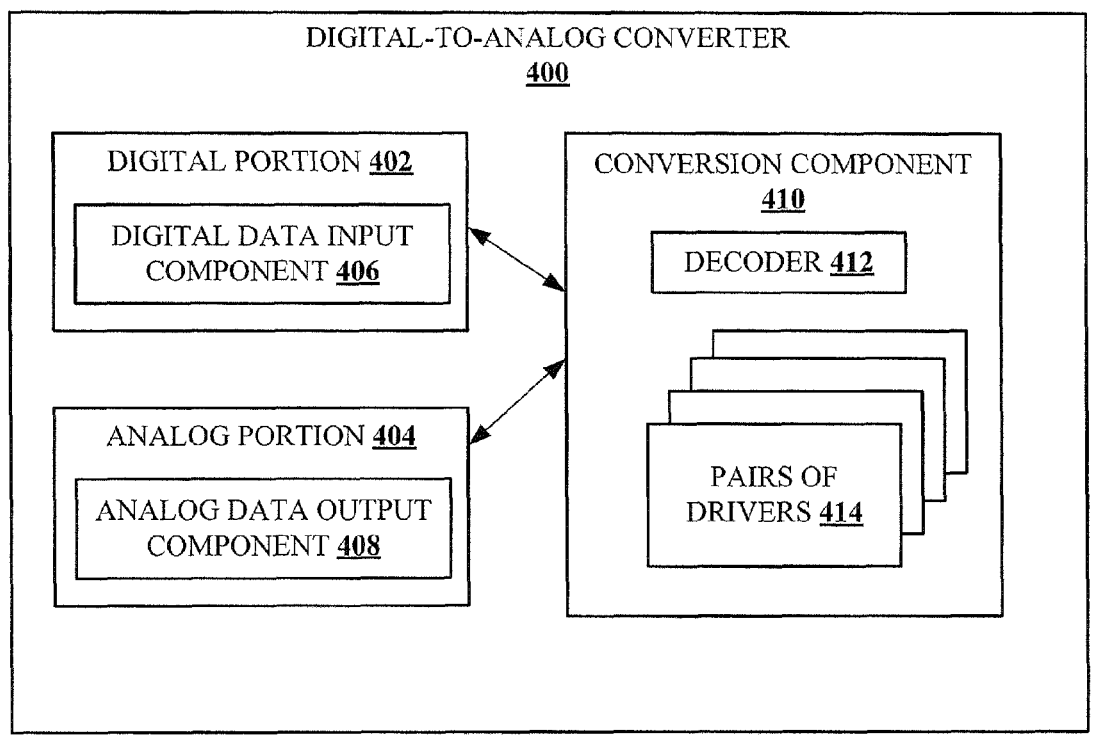
FIG. 4 illustrates an example, non-limiting schematic diagram of a digital-to-analog converter, according to an aspect.

FIG. 4 illustrates an example, non-limiting schematic diagram of a digital-to-analog converter 400, according to an aspect. The digital-to-analog converter 400 can be a high speed converter and can mitigate the amount of data dependent jitter generated by the converter.

Included in the digital-to-analog converter 400 can be a digital portion 402 and an analog portion 404, which can be communicatively coupled. Coupling can include various communications including, but not limited to, direct communications, indirect communications, wired communications, and/or wireless communications.

The digital portion 402 can include a digital data input component 406 that be configured to receive digital data. For example, the digital data can be received from an external source or from an internal source (e.g., internal to a device on which the digital-to-analog converter 400 is communicatively coupled).

The analog portion 404 can include an analog data output component 408. The analog data output component 408 can be configured to output an analog signal corresponding to the digital data.

The digital-to-analog converter 400 can also include a conversion component 410 communicatively coupled to the digital portion 402 and the analog portion 404. Included in the conversion component 410 can be a decoder 412 that can be configured to split a first data stream into two data streams and a second data stream into two data streams. The first data stream can include first set of digital data and the second data stream can include a second set of digital data. Further, the first data stream and the second data stream can be transmitted from the digital portion 402 (or the digital data input component 406) to the conversion component 410 (or the decoder 412).

In an example, the decoder 412 can be configured to split the first data stream into a first data sub-stream and a second data sub-stream. Further, the decoder 412 can be configured to split the second data stream into a third data stream and a fourth data stream.

The decoder 412 can also include at least four pairs of drivers 414. Each pair of drivers can include two drivers. For example, the at least four pairs of drivers 414 can include a first pair of drivers, a second pair of drivers, a third pair of drivers, and a fourth pair of drivers. Respective drivers of the first, second, third and fourth pairs of drivers can be configured to output respective data patterns comprising at least three consecutive identical bits. For example, the three consecutive identical bits can be a series of zeros "0" that represent a data pattern of 10001, 010001, 0010001, or 0001000.

Figure 5:
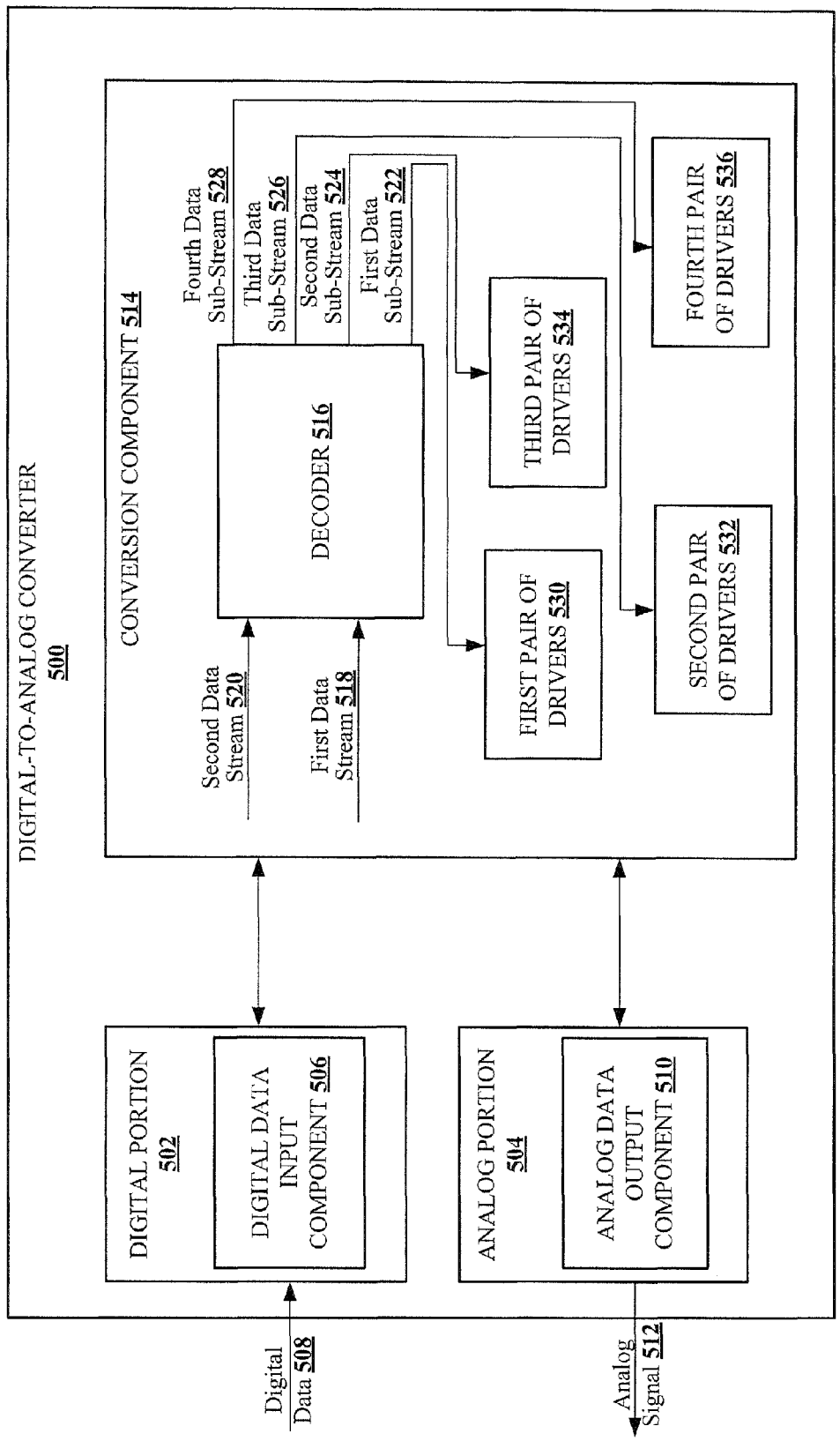
FIG. 5 illustrates another example, non-limiting schematic diagram of a digital-to-analog converter, according to an aspect.

FIG. 5 illustrates another example, non-limiting schematic diagram of a digital-to-analog converter 500, according to an aspect. The digital-to-analog converter 500 can be a high speed current steering digital-to-analog converter. Further, the digital-to-analog converter 500 can be configured for data dependent jitter reduction of switch driver signals.

The digital-to-analog converter 500 can include a digital portion 502 communicatively coupled to an analog portion 504. The digital portion can include a digital data input component 506 configured to receive digital data 508, The analog portion 504 can include an analog data output component 510 configured to output an analog signal 512 corresponding to the digital data 508.

Also included can be a conversion component 514 communicatively coupled to the digital portion 502 and the analog portion 504. The conversion component 514 can include a decoder 516 that can be configured to receive a first data stream 518 and a second data stream 520. The first data stream 518 can include a set of digital data and the second data stream 520 can include another set of digital data. According to an implementation, the first data stream 518 can include a data even data stream and the second data stream 520 can include a data odd data stream.

The decoder 516 can be configured to split the first data stream 518 into a first data sub-stream 522 and a second data sub-stream 524. The decoder 516 can also be configured to split the second data stream 520 into a third data sub-stream 526 and a fourth data sub-stream 528.

Further, the conversion component 514 can include four pairs of drivers, illustrated as a first pair of drivers 530, a second pair of drivers 532, a third pair of drivers 534, and a fourth pair of drivers 536. The first data sub-stream 522 can be received at the first pair of drivers 530. The third data sub-stream 526 can be received at the second pair of drivers 532. The second data sub-stream 524 can be received at the third pair of drivers 534. Further, the fourth data sub-stream 528 can be received at the fourth pair of drivers 536.

Further, each driver of the pair of drivers can operate on a different pulse of each clock cycle. For example, a first driver of the first pair of drivers 530 can be configured to receive the first data sub-stream 522 during a first clock pulse and a second driver of the first pair of drivers 530 can be configured to receive the first data sub-stream 522 during a different clock pulse.

Figure 6:
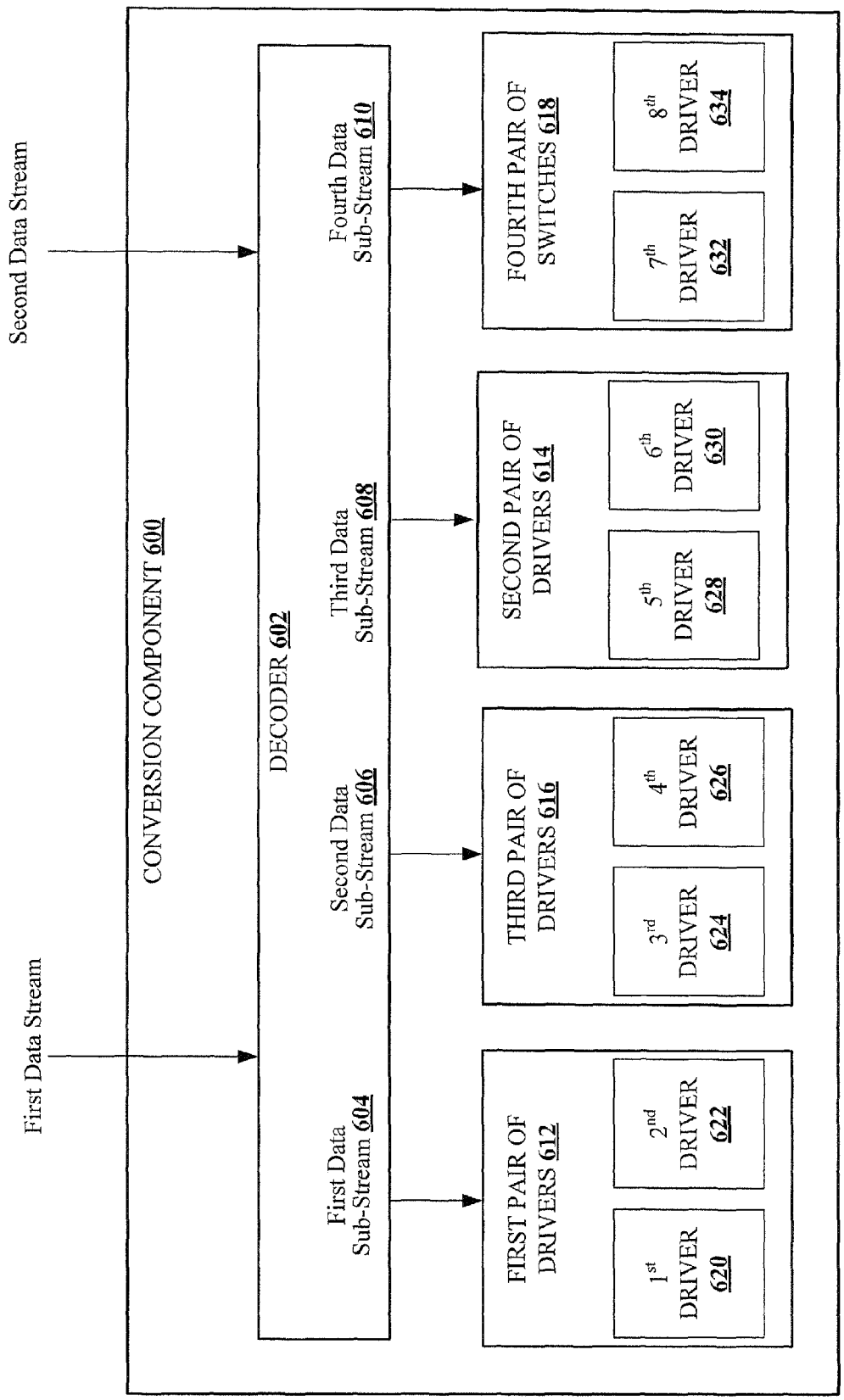
FIG. 6 illustrates an example, non-limiting conversion component, according to an aspect.

FIG. 6 illustrates an example, non-limiting conversion component 600, according to an aspect. Included in the conversion component 600 can be a decoder 602 that can be configured to split a first data stream comprising a set of digital data into a first data sub-stream 604 and a second data sub-stream 606. The decoder 602 can also be configured to split a second data stream comprising another set of digital data into a third data sub-stream 608 and a fourth data sub-stream 610.

Also included in the decoder 602 can be a first pair of drivers 612 that can be configured to receive the first data sub-stream 604 and a second pair of drivers 614 configured to receive the third data sub-stream 608. Further, the decoder 602 can include a third pair of drivers 616 configured to receive the second data sub-stream 606 and a fourth pair of drivers 618 configured to receive the fourth data sub-stream 610. Respective drivers of the first pair of drivers 612, the second pair of drivers 614, the third pair of drivers 616, and the fourth pair of drivers 618 can be configured to output respective data patterns comprising at least three consecutive identical bits. For example, the respective data patterns can be 10001 or the like.

For example, the first pair of drivers 612 can include a first driver 620 and a second driver 622. The third pair of drivers 616 can include a third driver 624 and a fourth driver 626. The second pair of drivers 614 can include a fifth driver 628 and a sixth driver 630. Further, the fourth pair of drivers 618 can include a seventh driver 632 and an eighth driver 634.

During a first clock pulse, the first driver 620 can be configured to receive a first high signal sent on the first data sub-stream 604. Further, during the first clock pulse, the second driver 622 can be configured to receive a first low signal (e.g., the inverse of the first high signal). Further, the second pair of drivers 614, the third pair of drivers 616, and the fourth pair of drivers 618 can be configured to receive respective first low signals during the first clock pulse.

During a second clock pulse, the fifth driver 628 of the second pair of drivers 614 can be configured to receive a second high signal on the third data sub-stream 608. Further to this implementation, the sixth driver 630 of the second pair of drivers 614 can be configured to receive a second low signal. In addition, the first pair of drivers 612, the third pair of drivers 616, and the fourth pair of drivers 618 can be configured to receive respective second low signals.

During a third clock pulse, the third driver 624 of the third pair of drivers 616 can be configured to receive a third high signal on the second data sub-stream 606. Further, during the third clock pulse, a fourth driver 626 of the third pair of drivers 616 can be configured to receive a third low signal. In addition, the first pair of drivers 612, the second pair of drivers 614, and the fourth pair of drivers 618 can be configured to receive respective third low signals.

During a fourth clock pulse, a seventh driver 632 of the fourth pair of drivers 618 can be configured to receive a fourth high signal on the fourth data sub-stream 610. Further to this implementation, an eighth driver 634 of the fourth pair of drivers 618 can be configured to receive a fourth low signal. In addition, the first pair of drivers 612, the second pair of drivers 614, and the third pair of drivers 616 can be configured to receive respective fourth low signals.

Further, during a fifth clock pulse, the first driver 620 can be configured to receive a fifth high signal. Further to this implementation, the second driver 622 can be configured to receive a fifth low signal. In addition, the second pair of drivers 614, the third pair of drivers 616, and the fourth pair of drivers 618 can be configured to receive respective fifth low signals.

According to another implementation, each pulse of the clock can represent half cycles of a clock cycle. For example, during a first clock pulse, the first driver 620 receives the first high signal and the second driver 622, the second pair of drivers 614, the third pair of drivers 615, and the fourth pair of drivers 618 can be configured to receive respective first low signals. During a second clock pulse, the second driver 622 can be configured to receive a second high signal and the first driver 620, the second pair of drivers 614, the third pair of drivers 616, and the fourth pair of drivers 618 can be configured to receive respective low signals. The first clock pulse and the second clock pulse can represent half cycles of a first clock cycle.

Further to this implementation, during a third clock pulse, the third driver 624 can be configured to receive a third high signal and the fourth driver 626, the first pair of drivers 612, the second pair of drivers 614, and the fourth pair of drivers 618 can be configured to receive respective third low signals. In addition, during a fourth clock pulse, the fourth driver 626 can be configured to receive a fourth high signal. Further, the third driver 624, the first pair of drivers 612, the second pair of drivers 614, and the fourth pair of drivers 618 can be configured to receive respective fourth low signals. The third clock pulse and the fourth clock pulse can represent half cycles of a second clock cycle.

In addition, during a fifth clock pulse, the fifth driver 628 can be configured to receive a fifth high signal and the sixth driver 630, the first pair of drivers 612, the third pair of drivers 616, and the fourth pair of drivers 618 can be configured to receive respective fifth low signals. Further, during a sixth clock pulse, the sixth driver 630 can be configured to receive a sixth high signal. Further, the fifth driver 628, the first pair of drivers 612, the third pair of drivers 616, and the fourth pair of drivers 618 can be configured to receive respective sixth low signals. The fifth clock pulse and the sixth clock pulse can represent half cycles of a third clock cycle.

Further, during a seventh clock pulse, the seventh driver 632 can be configured to receive a seventh high signal and the eighth driver 634, the first pair of drivers 612, the second pair of drivers 614, and the third pair of drivers 616 can be configured to receive respective seventh low signals. During an eighth clock pulse, the eighth driver 634 can be configured to receive a eighth high signal and the seventh driver 632, the first pair of drivers 612, the second pair of drivers 614, and the third pair of drivers 616 can be configured to receive respective eighth low signals. The seventh clock pulse and the eighth clock pulse can represent half cycles of a fourth clock cycle.

Further to this implementation, during a ninth clock pulse, the first driver 620 can be configured to receive a ninth high signal and the second driver 622, the second pair of drivers 614, the third pair of drivers 616, and the fourth pair of drivers 618 can be configured to receive respective ninth low signals. In addition, during a tenth clock pulse, the second driver 622 can be configured to receive a tenth high signal and the first driver 620, the second pair of drivers 614, the third pair of drivers 616, and the fourth pair of drivers 618 can be configured to receive respective tenth low signals. The ninth clock pulse and the tenth clock pulse can represent half cycles of a fifth clock cycle In view of the example circuits shown and described herein, methods that may be implemented in accordance with the one or more of the disclosed aspects, will be better understood with reference to the following flow charts. While, for purposes of simplicity of explanation, the methods are shown and described as a series of blocks, it is to be understood that the disclosed aspects are not limited by the number or order of blocks, as some blocks may occur in different orders and/or at substantially the same time with other blocks from what is depicted and described herein. Moreover, not all illustrated blocks may be required to implement the methods described hereinafter. It is noted that the functionality associated with the blocks may be implemented by software, hardware, a combination thereof or any other suitable means (e.g. device, system, process, component). Additionally, it is also noted that the methods disclosed hereinafter and throughout this specification are capable of being stored on an article of manufacture to facilitate transporting and transferring such methodologies to various devices. Those skilled in the art will understand that a method could alternatively be represented as a series of interrelated states or events, such as in a state diagram. The various methods disclosed herein can be performed by a system comprising at least one processor.

Figure 7:
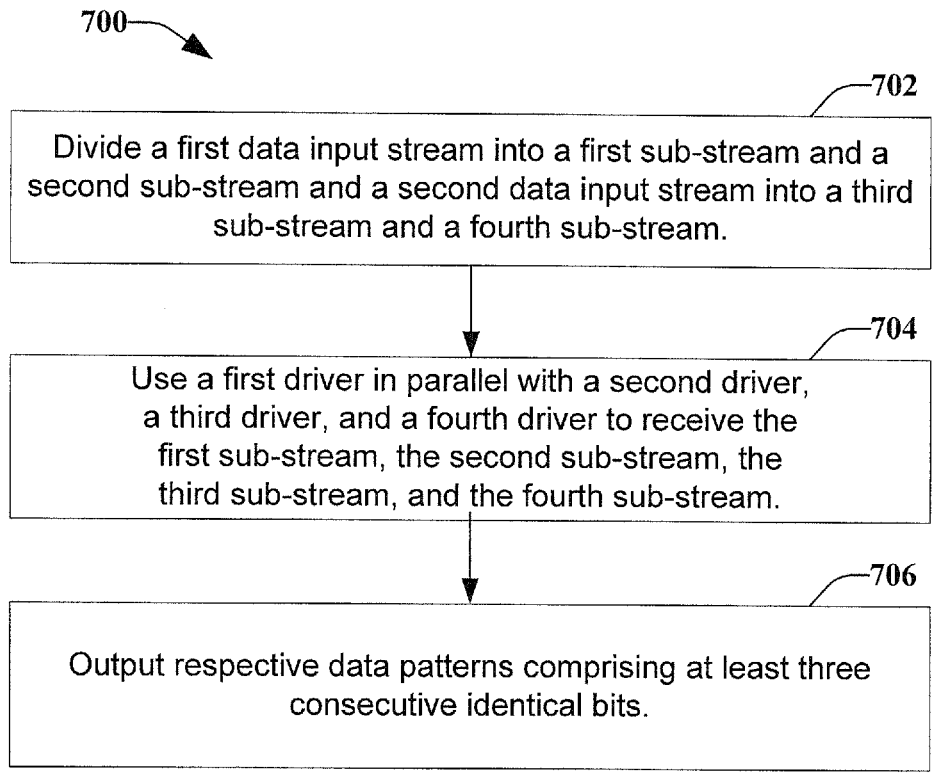
FIG. 7 illustrates an example, non-limiting method for data dependent jitter reduction of switch driver signals in high speed current steering digital-to-analog converters, according to an aspect.

FIG. 7 illustrates an example, non-limiting method 700 for data dependent jitter reduction of switch driver signals in high speed current steering digital-to-analog converters, according to an aspect.

At 702, a first data input stream can be divided into a first sub-stream and a second sub-stream and a second data input stream can be divided into a third sub-stream and a fourth sub-stream. For example, the first data input stream and the second data input stream can be divided using a decoder, such as decoder 412 of FIG. 4. According to some implementations, the first data stream is an even data stream and the second data stream is an odd data stream. According to other implementations, the first data stream can be an odd data stream and the second data stream can be an even data stream.

At 704, a first driver is used in parallel with a second driver, a third driver, and a fourth driver to receive the first sub-stream, the second sub-stream, the third sub-stream, and the fourth sub-stream. For example, the first driver can be configured to receive the first sub-stream, the second driver can be configured to receive the third sub-stream, the third driver can be configured to receive the second sub-stream, and the fourth driver can be configured to receive the fourth sub-stream.

Respective data patterns comprising at least three identical and consecutive bits can be output, at 706. For example, the respective data patterns can be represented as 10001 and can be output as a function of respective data signals received, during respective time periods, at the first driver, the second driver, the third driver, and the fourth driver. An output data pattern comprising at least three identical and consecutive bits can be utilized to reduce data dependent jitter of switch driver signals in high speed current steering digital-to-analog converters, as discussed herein.

Figure 8:
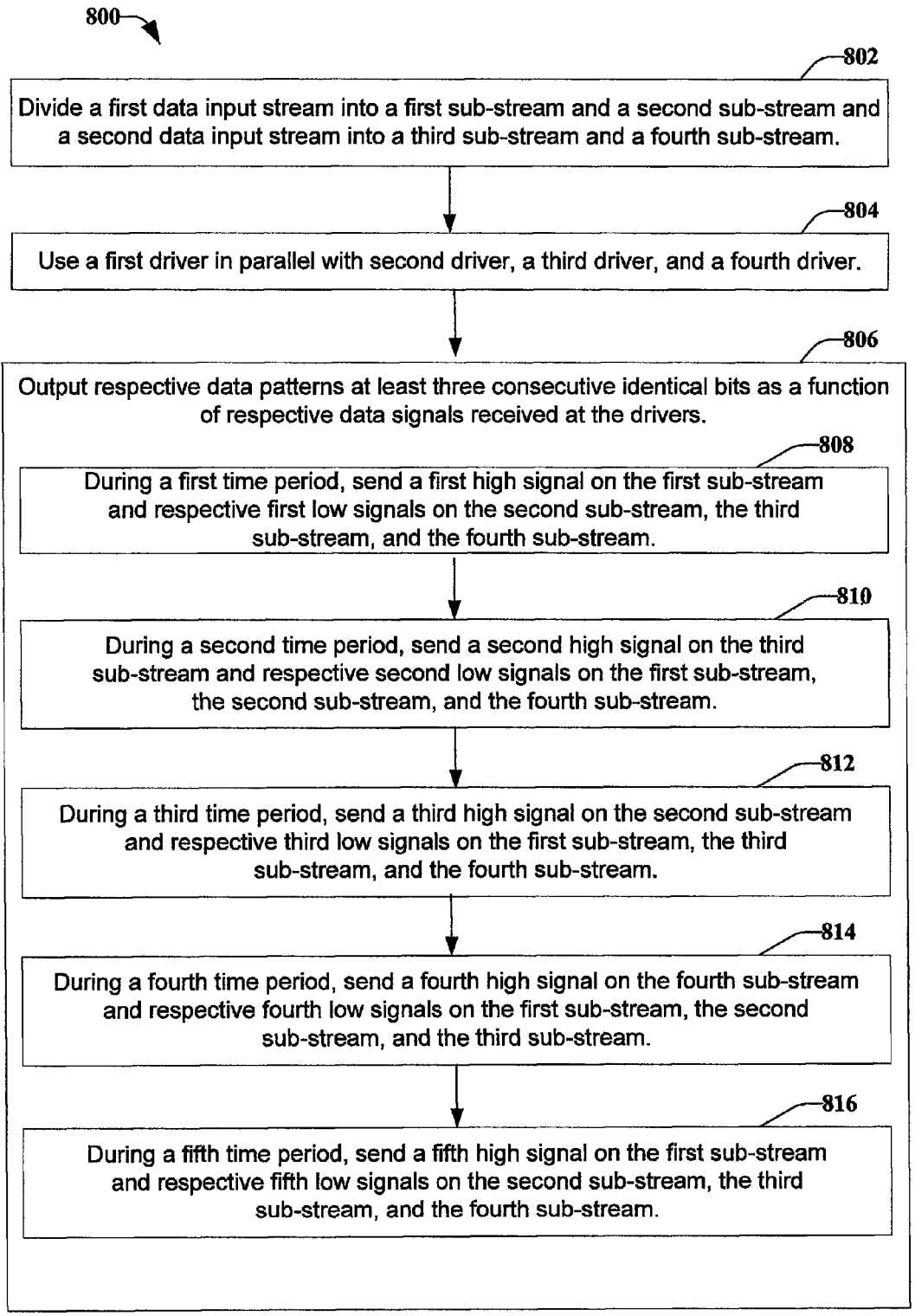
FIG. 8 illustrates another example, non-limiting method for data dependent jitter reduction, according to an aspect.

FIG. 8 illustrates another example, non-limiting method 800 for data dependent jitter reduction, according to an aspect. A first data input stream and a second data input stream are divided into sub-streams, at 802. For example, the first data input stream can be divided into a first sub-stream and a second sub-stream and the second data input stream can be divided into a third sub-stream and a fourth sub-stream.

At 804, a first driver is used in parallel with a second driver, a third driver, and a fourth driver. The first driver can be configured to receive the first sub-stream, the second driver can be configured to receive the third sub-stream, the third driver can be configured to receive the second sub-stream, and the fourth driver can be configured to receive the fourth sub-stream.

At 806, respective data patterns comprising at least three identical and consecutive bits are output as a function of respective data signals received, during respective time periods, at the first driver, the second driver, the third driver, and the fourth driver. According to an implementation, outputting the respective data patterns, at 806, can include sending, at 808, a first high signal on the first sub-stream and respective first low signals on the second sub-stream, the third sub-stream, and the fourth sub-stream, during a first time period. Further to this implementation, at 810, a second high signal can be sent on the third sub-stream and respective second low signals can be sent on the first sub-stream, the second sub-stream, and the fourth sub-stream, during a second time period. At 812, a third high signal can be sent on the second sub-stream and respective third low signals can be sent on the first sub-stream, the third sub-stream, and the fourth sub-stream, during a third time period.

In addition, according to this implementation, at 814, a fourth high signal can be sent on the fourth sub-stream and respective fourth low signals can be sent on the first sub-stream, the second sub-stream, and the third sub-stream, during a fourth time period. Further during a fifth time period, at 816, a fifth high signal can be sent on the first sub-stream and respective fifth low signals can be sent on the second sub-stream, the third sub-stream, and the fourth sub-stream.

According to an implementation, the method 800 can include receiving, during the first time period, the first high signal at the first driver and the respective first low signals at the second driver, the third driver, and the fourth driver. Further, during the second time period, the method can include receiving the second high signal at the second driver and the respective second low signals at the first driver, the third driver, and the fourth driver. In addition, during the third time period, the method can include receiving the third high signal at the third driver and the respective third low signals at the first driver, the second driver, and the fourth driver. Further to this implementation, during the fourth time period, the method can include receiving the fourth high signal at the fourth driver and the respective fourth low signals at the first driver, the second driver, and the third driver. In addition, during the fifth time period, the method can include receiving the fifth high signal at the first driver and the respective fifth low signals at the second driver, the third driver, and the fourth driver.

Figure 9:
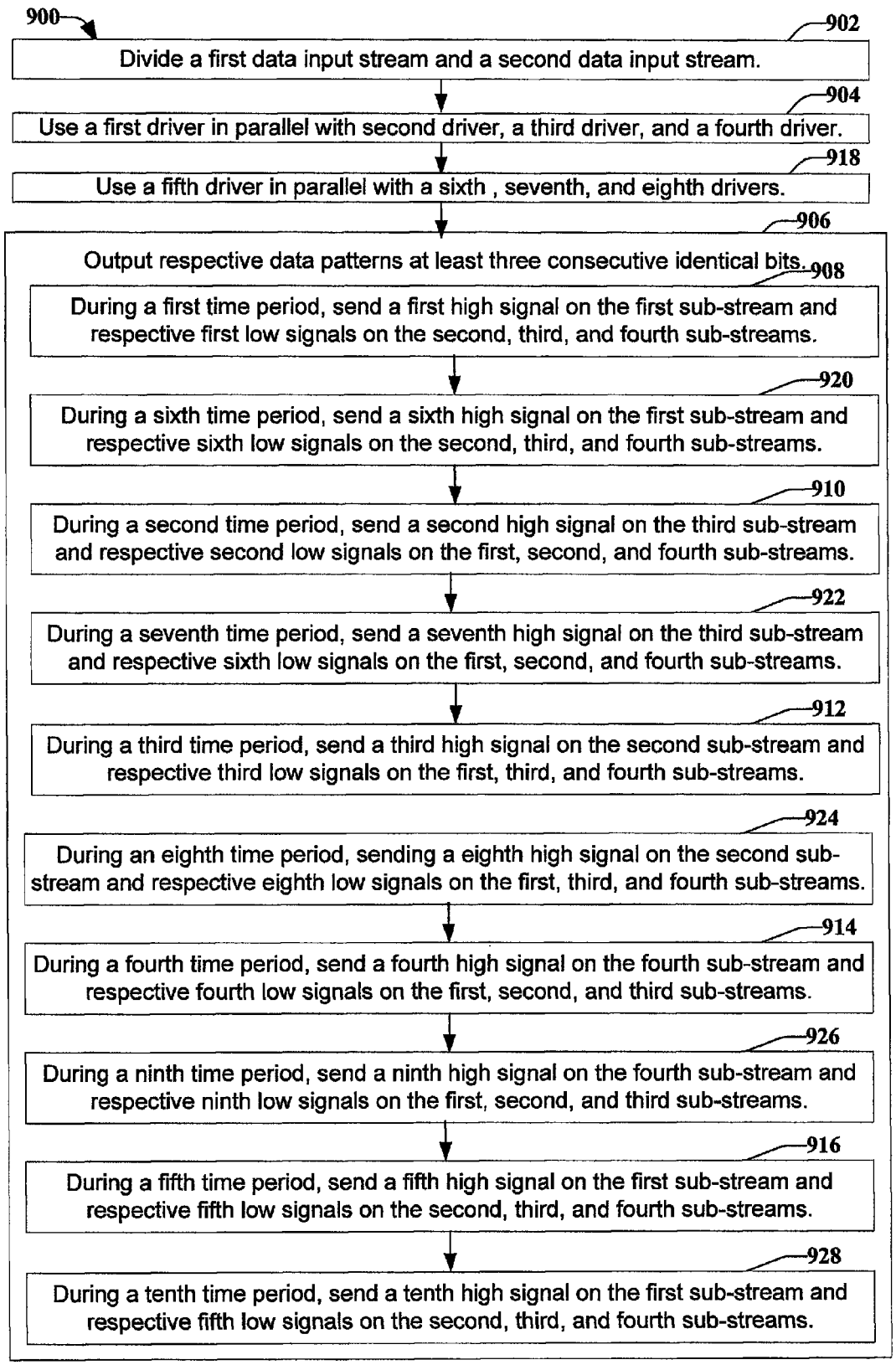
FIG. 9 illustrates an example, non-limiting method for receiving signals in order to reduce data dependent jitter, according to an aspect.

FIG. 9 illustrates another example, non-limiting method 900 for receiving signals in order to reduce data dependent jitter, according to an aspect. At 902, a first data stream and a second data stream are divided. For example, the first data stream can be divided into a first data sub-stream and a second data sub-stream and the second data input stream can be divided into a third data sub-stream and a fourth data sub-stream.

At 904, four drivers are used in parallel. For example, a first driver can be placed in parallel with a second driver, a third driver, and a fourth driver. At 906, respective data patterns comprising three or more consecutive identical bits are output by each of the first driver, the second driver, the third driver, and the fourth driver. The data patterns output by each driver can be based on respective data signals received at the drivers.

According to an implementation, outputting the respective data patterns, at 906, can include, at 908, sending a first high signal on the first sub-stream and respective low signals on the second, third, and fourth sub-streams during a first time period. At 910, a second high signal can be sent on the third sub-stream and respective second low signals can be sent on the first, second, and fourth sub-streams, during a second time period.

Further, at 912, a third high signal can be sent on the second sub-stream and respective third low signals can be sent on the first, third, and fourth sub-streams, during a third time period. At 914, a fourth high signal can be sent on the fourth sub-stream and respective fourth low signals can be sent on the first, second, and third sub-streams, during a fourth time period. In addition, at 916, a fifth high signal can be sent on the first sub-stream and respective fifth low signals can be sent on the second, third, and fourth subs-streams, during a fifth time period.

According to an implementation, method 900 can include using an additional four drivers in parallel, at 918. For example, a fifth driver can be used in parallel with a sixth driver, a seventh driver, and an eighth driver. The fifth driver can be configured to receive the first sub-stream, the sixth driver can be configured to receive the third sub-stream, the seventh driver can be configured to receive the second sub-stream, and the eighth driver can be configured to receive the fourth sub-stream. According to an implementation, the method can include producing, by the fifth driver, an output signal characterized by a data stream 10001.

Further to this implementation, the time periods can represent half clock cycles. Thus, during a sixth time period, a sixth high signal can be sent on the first sub-stream and respective sixth low signals can be sent on the second sub-stream, the third sub-stream, and the fourth sub-stream, at 920. The sixth time period can be an interval between the first time period and the second time period.

In addition, at 922, during a seventh time period, a seventh high signal can be sent on the third sub-stream and respective seventh low signals can be sent on the first sub-stream, the second sub-stream, and the fourth sub-stream. The seventh time period can be an interval between the second time period and the third time period.

At 924, during an eighth time period, an eighth high signal can be sent on the second sub-stream and respective eighth low signals can be sent on the first sub-stream, the third sub-stream, and the fourth sub-stream. The eighth time period can be an interval between the third time period and the fourth time period.

During a ninth time period, at 926, a ninth high signal can be sent on the fourth sub-stream and respective ninth low signals can be sent on the first sub-stream, the second sub-stream, and the third sub-stream. The ninth time period can be an interval between the fourth time period and the fifth time period Additionally, at 928, during a tenth time period, a tenth high signal can be sent on the first sub-stream and respective fifth low signals can be sent on the second sub-stream, the third sub-stream, and the fourth sub-stream. The tenth time period can be after the fifth time period.

According to various implementations, method can include receiving, during the sixth time period, the sixth high signal at the fifth driver and the respective sixth low signals at the sixth driver, the seventh driver, and the eighth driver. Further, the method can include receiving, during the sixth time period, the seventh high signal at the seventh driver and the respective seventh low signals at the fifth driver, the sixth driver, and the eighth driver.

In addition, during the seventh time period, the method can include receiving the seventh high signal at the sixth driver and the respective seventh low signals at the fifth driver, the seventh driver, and the eighth driver. Further, during the eighth time period, the method can include receiving the eighth high signal at the seventh driver and the respective eighth low signals at the fifth driver, the sixth driver, and the eighth driver.

Further to this implementation, the method can include receiving, during the ninth time period, the ninth high signal at the eighth driver and the respective ninth low signals at the fifth driver, the sixth driver, and the seventh driver. In addition, the method can include receiving, during the tenth time period, the tenth high signal at the fifth driver and the respective tenth low signals at the sixth driver, the seventh driver, and the eighth driver.

Example Computing Environment

Figure 10:
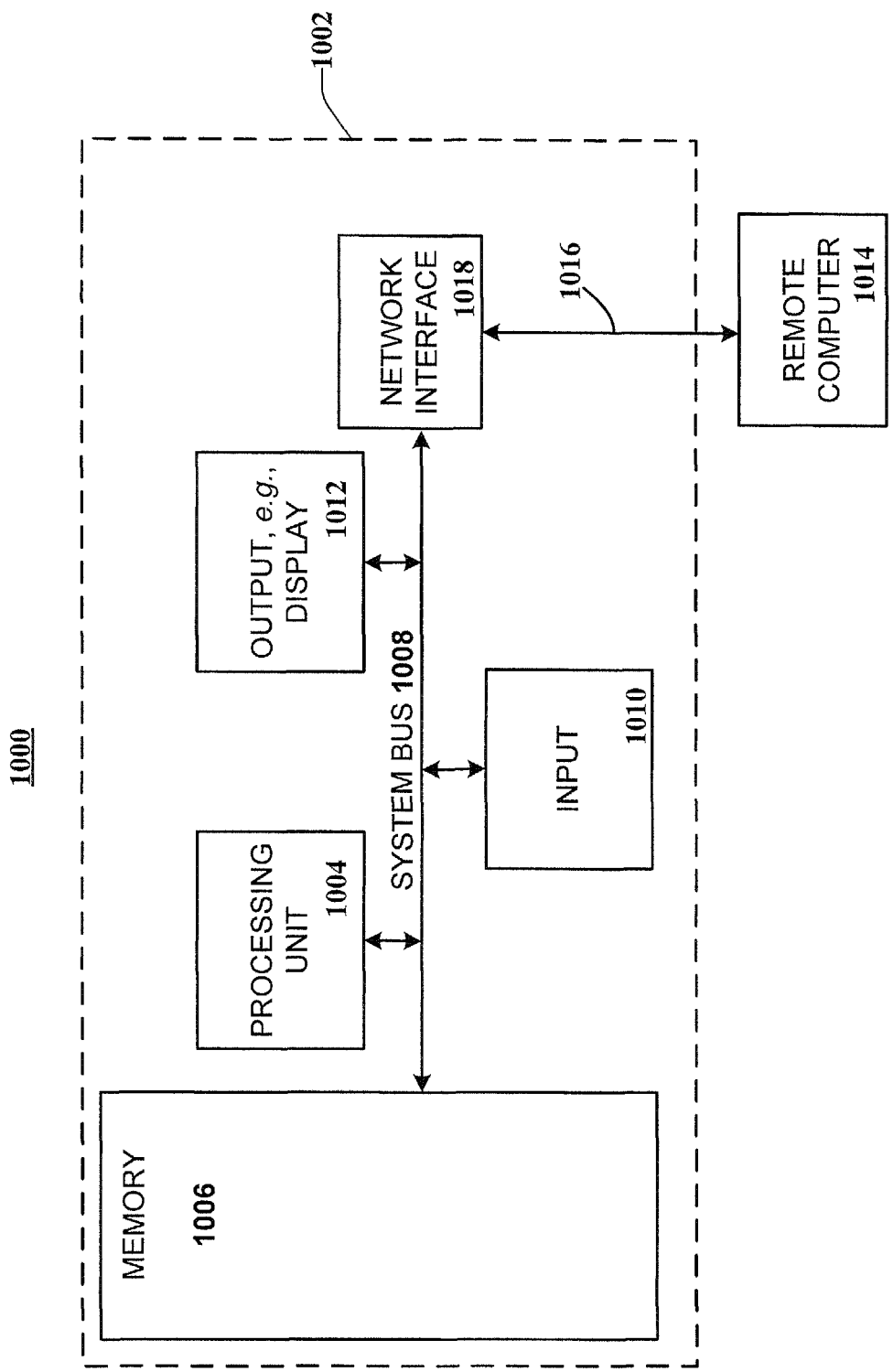
FIG. 10 illustrates a block diagram of an example data communication network that can be operable in conjunction with various aspects described herein.

As mentioned, advantageously, the techniques described herein can be applied to any device and/or network in which a digital-to-analog converter, such as a high speed current steering digital-to-analog converter is desirable in a multiprocessor system. It is to be understood, therefore, that handheld, portable and other computing devices and computing objects of all kinds are contemplated for use in connection with the various non-limiting embodiments, e.g., anywhere that a device may wish to implement power management for a multiprocessor system. Accordingly, the below general purpose remote computer described below in FIG. 10 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 10 illustrates a block diagram of an example electronic computing environment that can be implemented to facilitate data dependent jitter reduction of switch driver signals in high speed current steering digital-to-analog converters in conjunction with one or more aspects described herein. FIG. 10 therefore illustrates an example of a suitable computing system environment 1000 in which some aspects of the disclosed subject matter can be implemented, although as made clear above, the computing system environment 1000 is only one example of a suitable computing environment for a device and is not intended to suggest any limitation as to the scope of use or functionality of the disclosed subject matter. Neither should the computing environment 1000 be interpreted as having any dependency or requirement relating to any one or combination of components illustrated in the exemplary operating environment 1000.

With reference to FIG. 10, an exemplary device for implementing the disclosed subject matter includes a general-purpose computing device in the form of a computer 1002. Components of computer 1002 may include, but are not limited to, a processing unit 1004, a memory 1006, and a system bus 1008 that couples various system components including the system memory to the processing unit 1004. The system bus 1008 may be any of several types of bus structures including a memory bus or memory controller, a peripheral bus, and a local bus using any of a variety of bus architectures.

Computer 1002 typically includes a variety of computer readable media. Computer readable media can be any available media that can be accessed by computer 1002. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, compact disk read only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by computer 1002.

Communication media typically embodies computer readable instructions, data structures, program modules, or other data in a modulated data signal such as a carrier wave or other transport mechanism and includes any information delivery media.

The memory 1006 may include computer storage media in the form of volatile and/or nonvolatile memory such as ROM and/or RAM. A basic input/output system (BIOS), containing the basic routines that help to transfer information between elements within computer 1002, such as during start-up, may be stored in memory 1006. Memory 1006 typically also contains data and/or program modules that are immediately accessible to and/or presently being operated on by processing unit 1004. By way of example, and not limitation, memory 1006 may also include an operating system, application programs, other program modules, and program data.

The computer 1002 may also include other removable/non-removable, volatile/nonvolatile computer storage media. For example, computer 1002 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1008 through a non-removable memory interface such as an interface, and a magnetic disk drive or optical disk drive is typically connected to the system bus 1008 by a removable memory interface, such as an interface.

A user can enter commands and information into the computer 1002 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1004 through user input 1010 and associated interface(s) that are coupled to the system bus 1008, but may be connected by other interface and bus structures, such as a parallel port, game port, or a universal serial bus (USB). A graphics subsystem can also be connected to the system bus 1008. A projection unit in a projection display device, or a heads up display (HUD) in a viewing device or other type of display device can also be connected to the system bus 1008 via an interface, such as output interface 1012, which may in turn communicate with video memory. In addition to a monitor, computers can also include other peripheral output devices such as speakers which can be connected through output interface 1012.

The computer 1002 can operate in a networked or distributed environment using logical connections to one or more other remote computer(s), such as remote computer 1070, which can in turn have media capabilities different from computer 1002. The remote computer 1070 can be a personal computer, a server, a router, a network personal computer (PC), a peer device, personal digital assistant (PDA), cell phone, handheld computing device, a projection display device, a viewing device, or other common network node, or any other remote media consumption or transmission device, and may include any or all of the elements described above relative to the computer 1002. The logical connections depicted in FIG. 10 include a network 1016, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1002 can be connected to the LAN 1016 through a network interface 1018 or adapter. When used in a WAN networking environment, the computer 1002 can typically include a communications component, such as a modem, or other means for establishing communications over the WAN, such as the Internet. A communications component, such as wireless communications component, a modem and so on, which can be internal or external, can be connected to the system bus 1008 via the user input interface of input 1010, or other appropriate mechanism. In a networked environment, program modules depicted relative to the computer 1002, or portions thereof, can be stored in a remote memory storage device. It will be appreciated that the network connections shown and described are exemplary and other means of establishing a communications link between the computers can be used.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

Reference throughout this specification to "one embodiment", "an embodiment", "a disclosed aspect", or "an aspect" means that a particular feature, structure, or characteristic described in connection with the embodiment or aspect is included in at least one embodiment or aspect of the present disclosure. Thus, the appearances of the phrase "in one embodiment", "in one aspect", or "in an embodiment" in various places throughout this specification are not necessarily all referring to the same embodiment. Furthermore, the particular features, structures, or characteristics may be combined in any suitable manner in various disclosed embodiments.

As utilized herein, terms "component", "system", "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, and so on) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. In an example, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

Other than where otherwise indicated, all numbers, values and/or expressions referring to quantities of items such as memory size, etc., used in the specification and claims are to be understood as modified in all instances by the term "about."

What is claimed is:

1. A digital-to-analog converter, comprising:
a digital portion comprising a digital data input component configured for receiving digital data;
an analog portion communicatively coupled to the digital portion, the analog portion comprising an analog data output component configured for outputting an analog signal corresponding to the digital data; and
a conversion component communicatively coupled to the digital portion and the analog portion, the conversion component comprising:
a decoder configured for splitting a first data stream comprising a set of digital data into a first data sub-stream and a second data sub-stream, and for splitting a second data stream comprising another set of digital data into a third data sub-stream and a fourth data sub-stream;
a first pair of drivers configured for receiving the first data sub-stream;
a second pair of drivers configured for receiving the third data sub-stream;
a third pair of drivers configured for receiving the second data sub-stream; and
a fourth pair of drivers configured for receiving the fourth data sub-stream,
wherein respective drivers of the first, second, third, and fourth pairs of drivers are configured for outputting respective data patterns comprising at least three consecutive identical bits.

2. The digital-to-analog converter of claim 1, wherein during a first clock pulse,
a first driver of the first pair of drivers is configured for receiving a first high signal; and
a second driver of the first pair of drivers, the second pair of drivers, the third pair of drivers, and the fourth pair of drivers are configured for receiving respective first low signals.

3. The digital-to-analog converter of claim 2, wherein during a second clock pulse,
the second driver is configured for receiving a second high signal; and
the first driver, the second pair of drivers, the third pair of drivers, and the fourth pair of drivers are configured for receiving respective low signals, and the first clock pulse and the second clock pulse represent half cycles of a first clock cycle.

4. The digital-to-analog converter of claim 2, wherein during a second clock pulse,
a third driver of the second pair of drivers is configured for receiving a second high signal; and
a fourth driver of the second pair of drivers, the first pair of drivers, the third pair of drivers, and the fourth pair of drivers are configured for receiving respective second low signals.

5. The digital-to-analog converter of claim 4, wherein during a third clock pulse,
the fourth driver is configured for receiving a third high signal; and
the third driver, the first pair of drivers, the third pair of drivers, and the fourth pair of drivers are configured for receiving respective third low signals, the second clock pulse and the third clock pulse represent half cycles of a second clock cycle.

6. The digital-to-analog converter of claim 4, wherein during a third clock pulse,
a fifth driver of the third pair of drivers is configured for receiving a third high signal; and
a sixth driver of the third pair of drivers, the first pair of drivers, the second pair of drivers, and the fourth pair of drivers are configured for receiving respective third low signals.

7. The digital-to-analog converter of claim 6, wherein during a fourth clock pulse,
the sixth driver is configured for receiving a fourth high signal; and
the fifth driver, the first pair of drivers, the second pair of drivers, and the fourth pair of drivers are configured for receiving respective fourth low signals, the third clock pulse and the fourth clock pulse represent half cycles of a third clock cycle.

8. The digital-to-analog converter of claim 6, wherein during a fourth clock pulse,
   a seventh driver of the fourth pair of drivers is configured for receiving a fourth high signal; and
   an eighth driver of the fourth pair of drivers, the first pair of drivers, the second pair of drivers, and the third pair of drivers are configured for receiving respective fourth low signals.

9. The digital-to-analog converter of claim 8, wherein during a fifth clock pulse,
   the eighth driver is configured for receiving a fifth high signal; and
   the seventh driver, the first pair of drivers, the second pair of drivers, and the third pair of drivers are configured for receiving respective fifth low signals, the fourth clock pulse and the fifth clock pulse represent half cycles of a fourth clock cycle.

10. The digital-to-analog converter of claim 8, wherein during a fifth clock pulse,
    the first driver is configured for receiving a fifth high signal, and
    the second driver, the second pair of drivers, the third pair of drivers, and the fourth pair of drivers are configured for receiving respective fifth low signals.

11. The digital-to-analog converter of claim 10, wherein during a sixth clock pulse,
    the second driver is configured for receiving a sixth high signal; and
    the first driver, the second pair of drivers, the third pair of drivers, and the fourth pair of drivers are configured for receiving respective sixth low signals, the fifth clock pulse and the sixth clock pulse represent half cycles of a fifth clock cycle.

12. A method comprising:
    dividing a first data input stream into a first sub-stream and a second sub-stream and a second data input stream into a third sub-stream and a fourth sub-stream;
    using a first driver in parallel with a second driver, a third driver, and a fourth driver to receive the first sub-stream, the second sub-stream, the third sub-stream, and the fourth sub-stream, wherein the first driver is configured for receiving the first sub-stream, the second driver is configured for receiving the third sub-stream, the third driver is configured for receiving the second sub-stream, and the fourth driver is configured for receiving the fourth sub-stream; and
    outputting respective data patterns comprising at least three consecutive identical bits as a function of respective data signals received, during respective time periods, at the first driver, the second driver, the third driver, and the fourth driver.

13. The method of claim 12, wherein the first data input stream is an even data stream and the second data input stream is an odd data stream.

14. The method of claim 12, wherein dividing the data input streams comprises using a decoder to divide the first data input stream and the second data input stream.

15. The method of claim 12, wherein the outputting respective data patterns comprises performing:
    during a first time period, sending a first high signal on the first sub-stream and respective first low signals on the second sub-stream, the third sub-stream, and the fourth sub-stream,
    during a second time period, sending a second high signal on the third sub-stream and respective second low signals on the first sub-stream, the second sub-stream, and the fourth sub-stream,
    during a third time period, sending a third high signal on the second sub-stream and respective third low signals on the first sub-stream, the third sub-stream, and the fourth sub-stream,
    during a fourth time period, sending a fourth high signal on the fourth sub-stream and respective fourth low signals on the first sub-stream, the second sub-stream, and the third sub-stream, and
    during a fifth time period, sending a fifth high signal on the first sub-stream and respective fifth low signals on the second sub-stream, the third sub-stream, and the fourth sub-stream.

16. The method of claim 15, further comprising:
    receiving, during the first time period, the first high signal at the first driver and the respective first low signals at the second driver, the third driver, and the fourth driver;
    receiving, during the second time period, the second high signal at the second driver and the respective second low signals at the first driver, the third driver, and the fourth driver;
    receiving, during the third time period, the third high signal at the third driver and the respective third low signals at the first driver, the second driver, and the fourth driver;
    receiving, during the fourth time period, the fourth high signal at the fourth driver and the respective fourth low signals at the first driver, the second driver, and the third driver; and
    receiving, during the fifth time period, the fifth high signal at the first driver and the respective fifth low signals at the second driver, the third driver, and the fourth driver.

17. The method of claim 15, further comprising:
    using a fifth driver in parallel with a sixth driver, a seventh driver, and a eighth driver, wherein the fifth driver is configured for receiving the first sub-stream, the sixth driver is configured for receiving the third sub-stream, the seventh driver is configured for receiving the second sub-stream, and the eighth driver is configured for receiving the fourth sub-stream; and
    performing:
        during a sixth time period, sending a sixth high signal on the first sub-stream and respective sixth low signals on the second sub-stream, the third sub-stream, and the fourth sub-stream,
        during a seventh time period, sending a seventh high signal on the third sub-stream and respective seventh low signals on the first sub-stream, the second sub-stream, and the fourth sub-stream,
        during an eighth time period, sending an eighth high signal on the second sub-stream and respective eighth low signals on the first sub-stream, the third sub-stream, and the fourth sub-stream,
        during a ninth time period, sending a ninth high signal on the fourth sub-stream and respective ninth low signals on the first sub-stream, the second sub-stream, and the third sub-stream, and
        during a tenth time period, sending a tenth high signal on the first sub-stream and respective tenth low signals on the second sub-stream, the third sub-stream, and the fourth sub-stream.

18. The method of claim 17, wherein
the sixth time period is an interval between the first time period and the second time period, the seventh time period is an interval between the second time period and the third time period, the eighth time period is an interval between the third time period and the fourth time period, the ninth time period is an interval between the fourth time period and the fifth time period, and the tenth time period is after the fifth time period.

19. The method of claim 18, where the time periods represent half clock cycles.

20. The method of claim 17, further comprising:

receiving, during the sixth time period, the sixth high signal at the fifth driver and the respective sixth low signals at the sixth driver, the seventh driver, and the eighth driver;

receiving, during the seventh time period, the seventh high signal at the sixth driver and the respective seventh low signals at the fifth driver, the seventh driver, and the eighth driver;

receiving, during the eighth time period, the eighth high signal at the seventh driver and the respective eighth low signals at the fifth driver, the sixth driver, and the eighth driver;

receiving, during the ninth time period, the ninth high signal at the eighth driver and the respective ninth low signals at the fifth driver, the sixth driver, and the seventh driver; and receiving, during the tenth time period, the tenth high signal at the fifth driver and the respective tenth low signals at the sixth driver, the seventh driver, and the eighth driver.

21. The method of claim 17, further comprising:

producing, by the fifth driver, an output signal characterized by a data stream 10001.

22. An integrated circuit, comprising:

a decoder configured for splitting a first data input stream into a first sub-stream and a second sub-stream, and for splitting a second data input stream into a third sub-stream and a fourth sub-stream;

a first driver in parallel with a second driver, the first driver is configured for receiving the first sub-stream, the second driver is configured for receiving the third sub-stream;

a third driver in parallel with the second driver, the third driver is configured for receiving the second sub-stream;

a fourth driver in parallel with the third driver, the fourth driver is configured for receiving the fourth sub-stream; and a clock generator configured for outputting data representative of a plurality of clock pulse signals, wherein the first driver is configured for outputting "1" during a first clock pulse, "0" during a second clock pulse, a third clock pulse, and a fourth clock pulse, and "1" during a fifth clock pulse.

23. The integrated circuit of claim 22, wherein the second driver is configured for outputting "0" during the first clock pulse, the third clock pulse, the fourth clock pulse, and the fifth clock pulse, and for outputting "1" during the second clock pulse and a sixth clock pulse.

24. The integrated circuit of claim 22, wherein the third driver is configured for outputting "0" during the first clock pulse, the second clock pulse, the fourth clock pulse, the fifth clock pulse, a sixth clock pulse, and for outputting "1" during the third clock pulse and a seventh clock pulse.

25. The integrated circuit of claim 22, wherein the fourth driver is configured for outputting "0" during the first clock pulse, the second clock pulse, the third clock pulse, the fifth clock pulse, a sixth clock pulse, and a seventh clock pulse, and for outputting "1" during the fourth clock pulse and an eighth clock pulse.

* * * * *